(12) United States Patent
Park et al.

(10) Patent No.: US 12,622,198 B2
(45) Date of Patent: May 5, 2026

(54) EXHAUSTING DEVICE AND EXHAUSTING METHOD IN SUBSTRATE PROCESSING EQUIPMENT

(71) Applicant: SEMES CO., LTD., Cheonan-si (KR)

(72) Inventors: Jin Se Park, Incheon (KR); Ki Bong Kim, Paju-si (KR); Myung Seok Cha, Seoul (KR); Do Hyeon Yoon, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 883 days.

(21) Appl. No.: 17/714,999

(22) Filed: Apr. 6, 2022

(65) Prior Publication Data

US 2022/0384216 A1 Dec. 1, 2022

(30) Foreign Application Priority Data

May 26, 2021 (KR) ........................ 10-2021-0067380

(51) Int. Cl.
H01L 21/67 (2006.01)
(52) U.S. Cl.
CPC .............................. H01L 21/67017 (2013.01)
(58) Field of Classification Search
CPC .................... H01L 21/67017; H01L 21/67075
See application file for complete search history.

(56) References Cited

U.S. PATENT DOCUMENTS

| | | | | |
|---|---|---|---|---|
| 2,801,707 A | * | 8/1957 | Asker | B01D 53/26 |
| | | | | 95/122 |
| 7,278,831 B2 | * | 10/2007 | Bailey | H01L 21/67155 |
| | | | | 417/313 |
| 2005/0142010 A1 | * | 6/2005 | Bailey | F04D 25/00 |
| | | | | 417/423.4 |
| 2017/0283945 A1 | | 10/2017 | Yahata et al. | |

FOREIGN PATENT DOCUMENTS

| | | |
|---|---|---|
| CN | 1637283 | 7/2005 |
| JP | 2010-504847 | 2/2010 |
| JP | 2017-183393 | 10/2017 |
| JP | 2020-188135 | 11/2020 |
| KR | 10-2005-0071354 | 7/2005 |
| KR | 100918382 | 4/2009 |
| KR | 101035983 | 5/2010 |

OTHER PUBLICATIONS

Office Action from Japan Patent Office dated Apr. 18, 2023.
Office Action from Korean Intellectual Property Office dated Jan. 26, 2023.
Office Action from the China National Intellectual Property Administration dated Jun. 21, 2024.

* cited by examiner

*Primary Examiner* — Steven S Anderson, II

(57) ABSTRACT

The present invention discloses an exhausting device and an exhausting method in substrate processing equipment, and more particularly, a technique for controlling a processing process environment by providing a buffer space for storing chemical fumes outside a ventilation unit of the substrate processing equipment, and discharging the chemical fumes into the buffer space in accordance with a processing process in a chamber interior space.

13 Claims, 12 Drawing Sheets

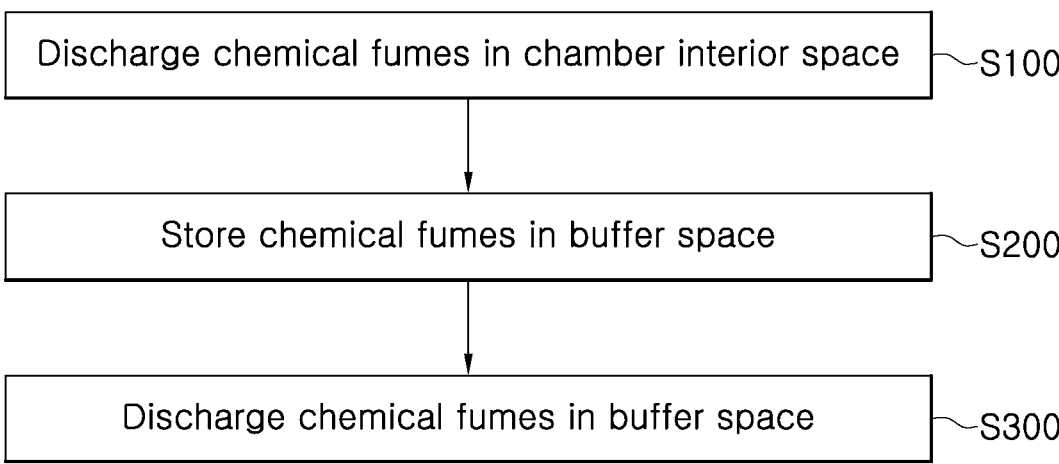

| Discharge chemical fumes in chamber interior space | ~S100 |
| Store chemical fumes in buffer space | ~S200 |
| Discharge chemical fumes in buffer space | ~S300 |

FIG. 10

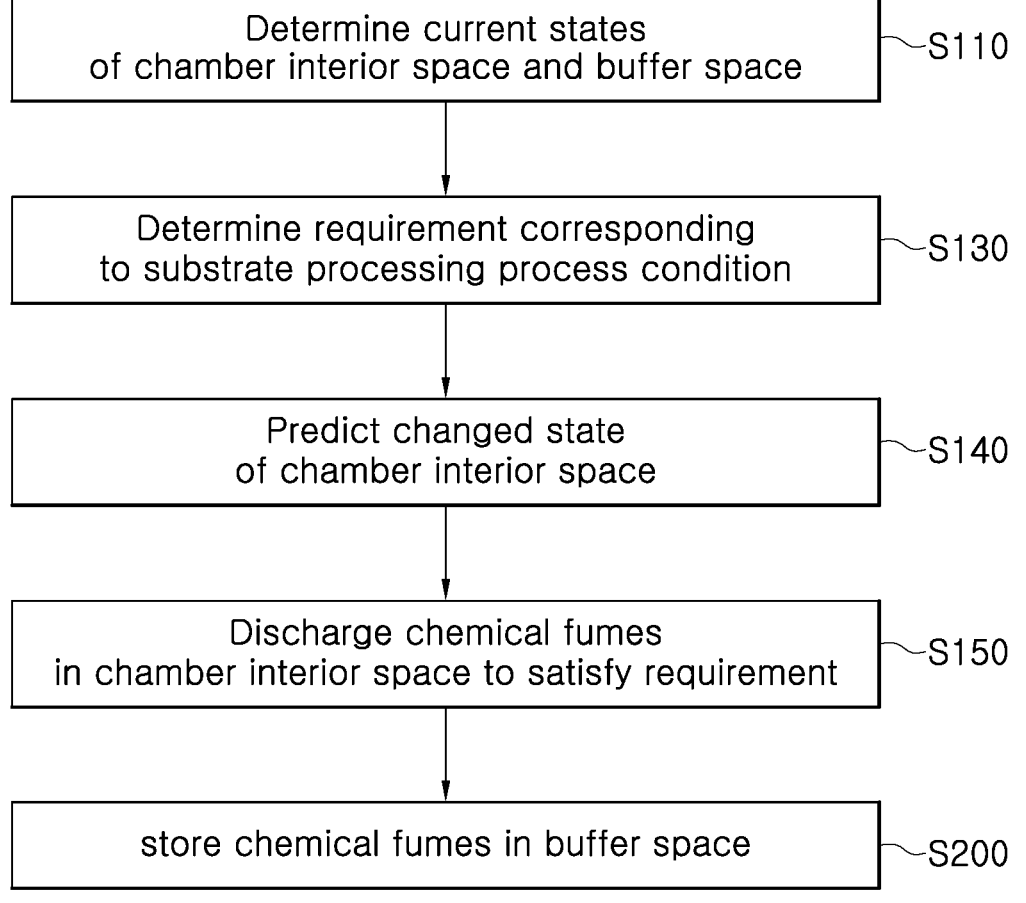

| Determine current states of chamber interior space and buffer space | ~S110 |
| Determine requirement corresponding to substrate processing process condition | ~S130 |
| Predict changed state of chamber interior space | ~S140 |
| Discharge chemical fumes in chamber interior space to satisfy requirement | ~S150 |
| store chemical fumes in buffer space | ~S200 |

EXHAUSTING DEVICE AND EXHAUSTING METHOD IN SUBSTRATE PROCESSING EQUIPMENT

CROSS REFERENCE TO RELATED APPLICATION

The present application claims priority to Korean Patent Application No. 10-2021-0067380, filed May 26, 2021, the entire contents of which are incorporated by reference herein for all purposes.

BACKGROUND OF THE INVENTION

1. Field of the Invention

The present invention relates to an exhausting device and an exhausting method in substrate processing equipment, and more particularly, to a technique for controlling a processing process environment by providing a buffer space for storing chemical fumes outside a ventilation unit of the substrate processing equipment, and discharging the chemical fumes into the buffer space in accordance with a processing process in a chamber interior space.

2. Description of the Related Art

In the case of processes (for example, cleaning process and etching process) using various chemical solutions among semiconductor manufacturing processes, during such processes, chemical fumes are generated in substrate processing equipment by the chemical solutions. The chemical fumes and impurities contained in the fumes contaminate a semiconductor substrate and cause process accidents.

Thus, the substrate processing equipment includes an exhausting device for removing the chemical fumes generated during the process or impurities contained in the chemical fumes. The exhausting device is connected to an exhaust duct through the bottom surface of a place where the substrate processing equipment is installed, to remove chemical fumes and impurities contained in the chemical fumes to the outside.

A ventilation unit is provided at the end of the exhaust duct to discharge the chemical fumes flowing in the exhaust duct by operating a ventilation fan. At this time, the amount of chemical fumes is generated differently depending on the type of chemical solution used in a substrate processing process or the type of process. Thus, it is necessary to appropriately regulate the discharge amount of chemical fumes. For example, when a sulfuric acid solution is used in a cleaning process or an etching process, a relatively large amount of chemical fumes is generated, so the exhaust amount is required to be increased accordingly.

Meanwhile, when the chemical fumes generated from the substrate processing equipment are directly discharged to the outside, the internal pressure and the temperature of a chamber in the substrate processing equipment change by the discharge of the chemical fumes. Thus, there is a problem that it is not possible to maintain the temperature and the pressure required for the substrate processing process. In particular, when it is difficult to set the temperature and pressure in the chamber to predetermined levels required in the substrate processing process, this causes a problem of decreasing process yield.

Examples of the related art include Korean Patent No. 10-1035983 and Korean Patent No. 10-0918382.

SUMMARY OF THE INVENTION

The present invention has been made to solve the problems in the related art as described above, and an object of the present invention is to solve the problem that it is not possible to maintain an environment required in the substrate processing process due to the discharge of chemical fumes generated in the substrate processing equipment.

In particular, another object of the present invention is to solve the problem that the pressure, the temperature, and the like in a chamber interior space in the substrate processing equipment are rapidly changed due to a difference in pressure, temperature, and the like between the inside and the outside of the substrate processing equipment, when chemical fumes are discharged through an exhaust duct in the substrate processing equipment.

Furthermore, still another object of the present invention is to solve the problem that, when processes are performed by simultaneously operating a plurality of chambers in the substrate processing equipment including a plurality of chambers, it is not possible to obtain the yield of the uniform quality level due to a difference in environmental conditions such as the pressure and the temperature between the chambers.

The objects of the present invention are not limited to the above description, and other objects and advantages of the invention which are not mentioned can be clearly understood by those skilled in the art as described below.

According to an embodiment of the present invention, an exhausting device in substrate processing equipment include a ventilation unit that discharges chemical fumes in the chamber interior space, a buffer member that forms a sealed buffer space on an outer surface of the ventilation unit and stores the chemical fumes discharged from the ventilation unit to control a processing process environment in the chamber interior space, an exhaust unit that discharges the chemical fumes stored in the buffer space, and a control unit that controls the ventilation unit and the exhaust unit to regulate an inflow amount and a discharge amount of the chemical fumes with respect to the buffer space, so as to control the processing process environment in the chamber interior space.

According to an embodiment of the present invention, an exhausting method in substrate processing equipment includes a chamber chemical fume discharging step of discharging chemical fumes in a chamber interior space into a buffer space through a ventilation unit, a chemical fume storing step of storing the chemical fumes discharged from the chamber interior space, in the buffer space, and a buffer chemical fume discharging step of discharging the chemical fumes stored in the buffer space through an exhaust unit.

According to an embodiment of the present invention, an exhausting device in substrate processing equipment includes: a ventilation unit including a ventilation fan for discharging chemical fumes in a chamber interior space, a shutter frame that is mounted on an outer surface of the ventilation fan and has a plurality of through holes formed in the shutter frame, and a plurality of shutters that are provided with the plurality of through holes and each shutter selectively opens or closes a corresponding through hole of the plurality of through holes in accordance with rotation by a predetermined angle; a buffer member that stores chemical fumes discharged from the ventilation unit to control a processing process environment in the chamber interior space through a buffer space, the buffer member including a bulkhead frame that forms the buffer space by one side being closely coupled with a periphery of the ventilation unit to include the outer surface of the ventilation unit, and a cover coupled to the other side of the bulkhead frame to seal the buffer space; an exhaust unit that regulates a discharge amount of chemical fumes stored in the buffer space, the exhaust unit including an exhaust tube connected to the buffer space, a support installed at the middle of the exhaust tube in a radial direction of the exhaust tube, a damper that is supported by the support and selectively opens or closes the exhaust tube in accordance with rotation of the support, and a concentration meter that is mounted at an inlet of the exhaust tube and measures chemical fume concentration in the buffer space; and an exhaust control unit that controls a discharge of the chemical fumes by selectively controlling the ventilation unit and the exhaust unit according to: at least one of factors among an internal temperature, a pressure, and an expected generation amount of chemical fumes, which are substrate processing conditions to be satisfied in a chamber and at least one of factors among a current internal temperature, a pressure, and a chemical fume concentration in each of the chamber interior space and the buffer space.

According to the present invention as described above, it is possible to control a processing process environment by providing a buffer space for storing chemical fumes outside a ventilation unit of the substrate processing equipment and discharging the chemical fumes in accordance with a processing process in a chamber interior space.

In particular, since the chemical fume discharge amount in the chamber interior space is regulated, and the chemical fumes are temporarily stored in the buffer space, and then the chemical fume discharge amount in the buffer space is regulated, and the chemical fumes are discharged, it is possible to reduce the environmental change of the chamber interior space to the minimum, and thus to stably maintain a requirement for a substrate processing process.

Furthermore, when a plurality of chambers are disposed in substrate processing equipment and substrate processing processes are simultaneously performed, the environmental conditions in each chamber interior space may change differently depending on the discharge of the chemical fumes, but the environment in the chamber interior space can be maintained at a predetermined level by the buffer space, and thus it is possible to perform mass production while maintaining the quality of the same level in multiple chambers.

The effects of the present invention are not limited to the effects described above, and effects not mentioned can be clearly understood by those skilled in the art, from the specification and the attached drawings.

BRIEF DESCRIPTION OF THE DRAWINGS

The above and other objectives, features, and other advantages of the present disclosure will be more clearly understood from the following detailed description taken in conjunction with the accompanying drawings, in which:

FIGS. 7A and 7B illustrate an example of an operation mode of an exhaust pressure regulator of the exhaust unit in the exhausting device according to the present invention.

FIG. 9 is a flowchart illustrating an example of an exhausting method in substrate processing equipment according to the present invention.

FIG. 10 is a flowchart illustrating an example of a procedure of discharging chemical fumes in a chamber interior space in the exhausting method in the substrate processing equipment according to the present invention.

DESCRIPTION OF EMBODIMENTS

Hereinafter, preferred embodiments of the present invention will be described in detail with reference to the accompanying drawings, but the present invention is not limited by the embodiments.

In order to describe the present disclosure, the operational advantages of the present disclosure, and the objectives achieved by the present disclosure, preferred embodiments of the present disclosure are illustrated below, and the present disclosure is described with reference to the embodiments.

First, the terminology used herein is for the purpose of describing particular embodiments only and is not intended to be limiting. As used herein, the singular forms "a", "an", and "the" are intended to include the plural forms as well, unless the context clearly indicates otherwise. The terms "comprise", "include", "have", and the like when used in this application should be understood to specify the presence of stated features, numbers, steps, operations, elements, components, or combinations thereof but not to preclude the presence or addition of one or more other features, numbers, steps, operations, elements, components or combinations thereof.

In describing the present disclosure, when it is decided that a detailed description of a known configuration or function related to the disclosure makes the gist of the disclosure unclear, the detailed description will be omitted.

The present invention provides an exhausting device and an exhausting method capable of controlling a processing process environment by providing a buffer space for storing chemical fumes outside a ventilation unit of the substrate processing equipment, and discharging the chemical fumes into the buffer space in accordance with a processing process in a chamber interior space.

Figure 1:
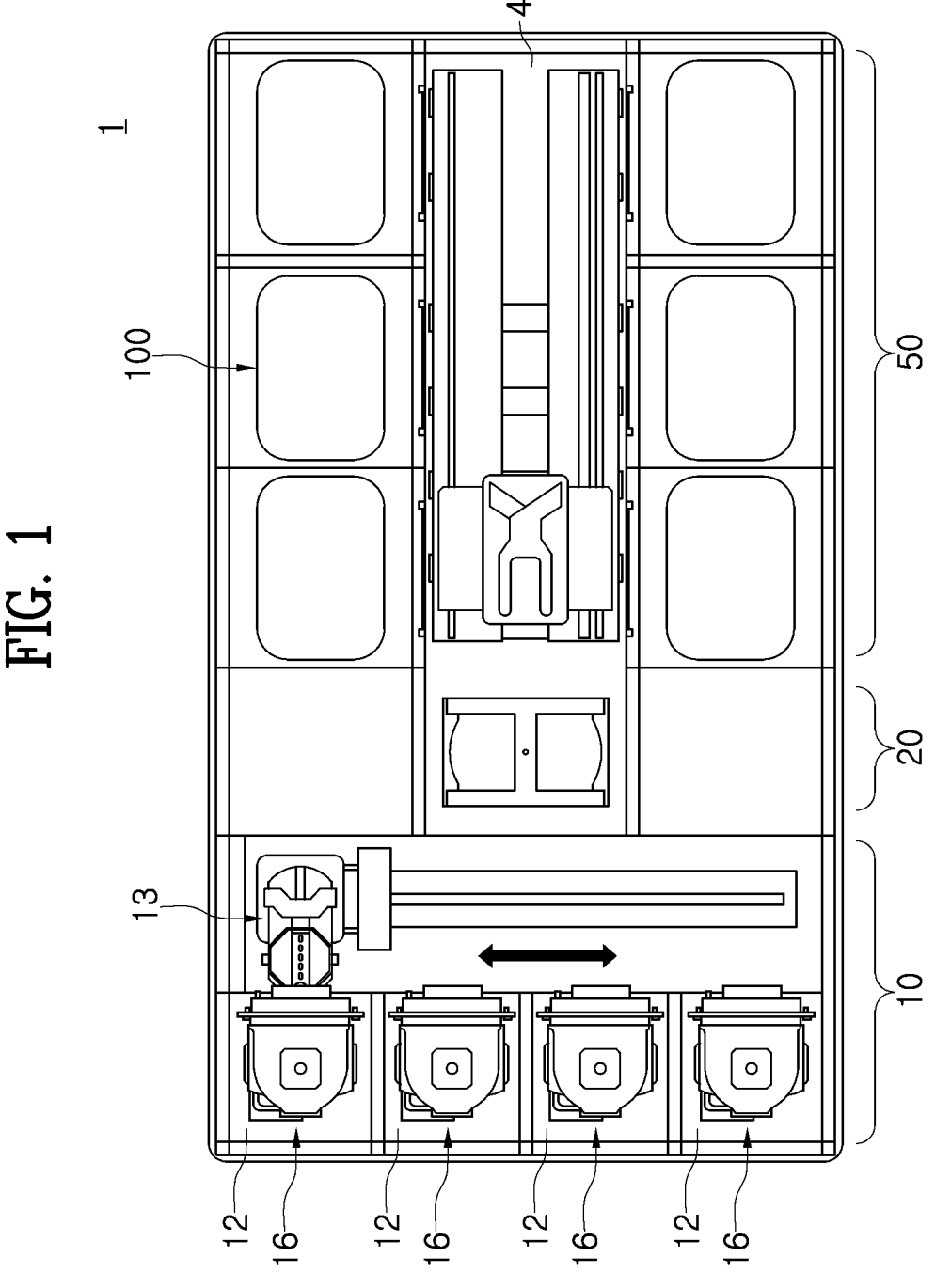
FIG. 1 illustrates an example of substrate processing equipment to which an exhausting device according to the present invention is applied.

FIG. 1 illustrates an example of substrate processing equipment to which an exhausting device according to the present invention is applied.

With reference to FIG. 1, substrate processing equipment 1 to which an exhausting device according to the present invention is applied may include an index unit 10, a buffer unit 20, and a processing unit 50. The index unit 10, the buffer unit 20, and the processing unit 50 are arranged in a line.

The index unit 10 may include four load ports 12 and one index robot 13.

The four load ports 12 are disposed in front of the index unit 10. A plurality of load ports 12 are provided, and the number of load ports 12 may increase or decrease in accordance with process efficiency and footprint conditions of the substrate processing equipment 1. Carriers (for example, cassettes or FOUPs) in which a substrate W to be provided for a process and a substrate W on which the process is completed are accommodated are mounted in the load ports 12. A plurality of slots for accommodating substrates in a state of being arranged horizontally with respect to the ground are formed in the carrier 16.

The index robot 13 is installed between the load port 12 and the buffer unit 20. The index robot 13 transports a substrate W waiting on the top of the buffer unit 20 to the carrier 16, or transports the substrate W waiting on the carrier 16 to the bottom of the buffer unit 20.

The buffer unit 20 is installed between the index unit 10 and the processing unit 50. The buffer unit 20 is a place in which the substrate W to be provided for the process before being transported by the index robot 13 or the substrate W on which the process is completed before being transported by a main transport robot 30 is temporarily accommodated and waits.

The main transport robot 30 is installed in a moving passage 40, and transports substrates between the respective substrate processing apparatuses 100 and the buffer unit 20. The main transport robot 30 transports a substrate that waits in the buffer unit 20 and is to be provided for a process, to the corresponding substrate processing apparatus 100, or transports a substrate on which the process is completed by the corresponding substrate processing apparatus 100, to the buffer unit 20.

The moving passage 40 provides a passage through which the main transport robot 30 moves. The substrate processing apparatuses 100 are disposed on both sides of the moving passage 40 to face each other. A moving rail is installed on the moving passage 40. The main transport robot 30 moves on the moving rail, and the moving rail is capable of ascending and descending to the upper and lower levels of the substrate processing apparatus 100 and the upper and lower levels of the buffer unit 20.

The substrate processing apparatuses 100 are disposed to face each other, on both sides of the moving passage 40 in which the main transport robot 30 is installed. The substrate processing equipment 1 includes a plurality of substrate processing apparatuses 100 forming multiple levels, but the number of substrate processing apparatuses 100 may increase or decrease in accordance with the process efficiency and the footprint conditions of the substrate processing equipment 1. Each substrate processing apparatus 100 is configured as an independent housing, and thus, a process of processing a substrate in an independent form can be performed in each substrate processing apparatus 100.

In the substrate processing apparatus 100, various substrate processing processes such as an etching process or a cleaning process on a substrate are performed. In one example, the substrate processing apparatus 100 may include a spin chuck in a chamber, and perform an etching process or a cleaning process by supplying a chemical solution while rotating a substrate in a state where the substrate is mounted on the spin chuck. As the substrate processing process is performed, chemical fumes are generated in a chamber interior space, and the chemical fumes and impurities contained in the fumes are discharged through an exhaust duct at the bottom of the chamber.

As the chemical fumes are discharged from the substrate processing apparatus 100, the environment of the chamber interior space may be changed. Since the chamber interior space and an external space to which the chemical fumes are discharged have a large difference in temperature and pressure, the temperature and the pressure in the chamber interior space change by discharging the chemical fumes in the chamber interior space into the external space.

Such a change in the temperature and the pressure in the chamber interior space has a significant influence on substrate processing process conditions, and thus causes a problem of decreasing the process yield. In particular, when a plurality of substrate processing apparatuses 100 simultaneously perform substrate processing processes, the temperature and the pressure differ. Thus, substrate processing results obtained by processing of the respective substrate processing apparatuses 100 have differences, and such differences causes a problem that it is not possible to maintain mass production of products having the same quality.

Thus, the present invention provides an exhausting device and an exhausting method in substrate processing equipment, which are capable of maintaining an environment of the chamber interior space in a range of a predetermined level, by temporarily storing chemical fumes in the chamber interior space, in a buffer space, and then discharging the chemical fumes in order to satisfy various requirements such as the temperature and the pressure required during the substrate processing process in the chamber interior space.

Figure 2:
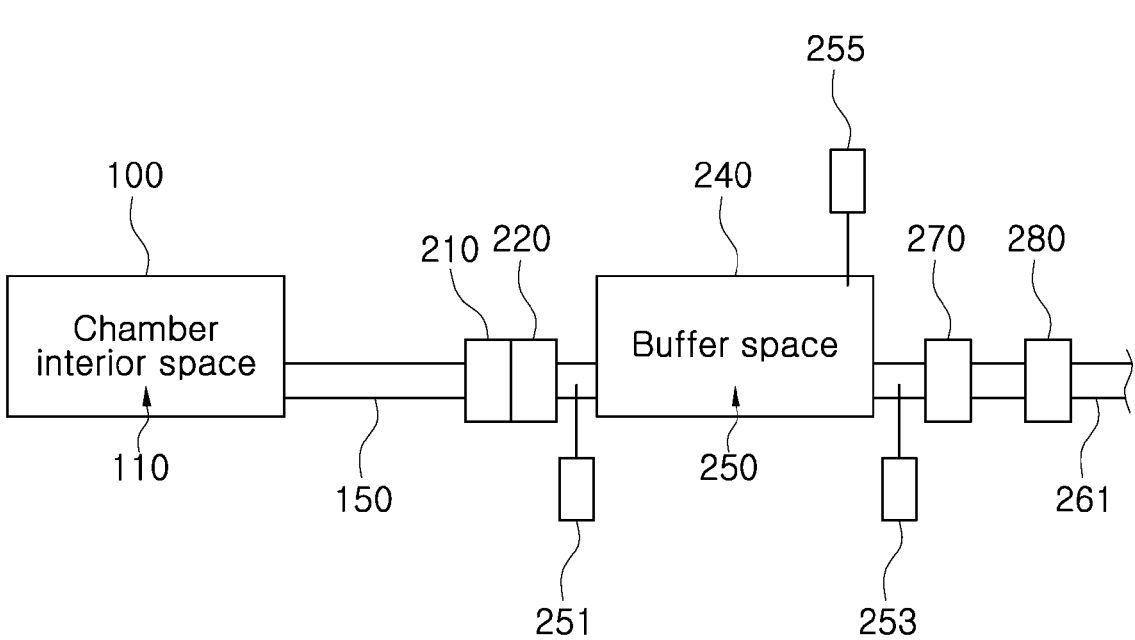
FIG. 2 is a schematic configuration diagram illustrating the exhausting device according to the present invention.

FIG. 2 is a schematic configuration diagram illustrating the exhausting device according to the present invention.

An exhausting device 200 according to the present invention is connected to an exhaust tube 150 for discharging chemical fumes from the chamber interior space 110 of the substrate processing apparatus 100.

The exhausting device 200 may include a ventilation unit, a buffer member, an exhaust unit, a control unit, and the like.

The ventilation unit may include a ventilation fan 210 that discharges chemical fumes from the chamber interior space 110 through the exhaust tube 150 and a ventilation regulator 220 that is mounted on the ventilation fan 210 and regulates a chemical fume discharge amount of the ventilation fan 210. The ventilation unit may further include a flow meter 251 that measures a discharge amount of chemical fumes through the ventilation fan 210.

A buffer space 250 is formed by a buffer member 250 mounted on the outer surface of the ventilation unit. The buffer space 250 formed by being sealed on the outer surface of the ventilation unit by the buffer member 250 temporarily stores chemical fumes discharged from the ventilation unit in order to control a processing process environment of the chamber interior space 110.

The exhaust unit discharges the chemical fumes stored in the buffer space 250. For this, the exhaust unit may include an exhaust tube 261 connected to the buffer space 250 and an exhaust pressure generator 280 that regulates the discharge amount from the exhaust tube 261. The exhaust unit may further include an exhaust pressure regulator 270 mounted in the exhaust tube 261 in front of the exhaust pressure generator 280 to regulate the exhaust pressure of the exhaust pressure generator 280.

Furthermore, a concentration meter 255 that measures the chemical fumes concentration in the buffer space 250 may be provided at an inlet of the exhaust tube 261, and a flowmeter 253 that measures the discharge amount may be provided in the exhaust tube 261.

A control unit (not shown) controls the processing process environment of the chamber interior space 110 by controlling the ventilation unit and the exhaust unit to regulate the inflow amount and the discharge amount of chemical fumes into and from the buffer space 250.

In particular, the control unit may control a discharge of the chemical fumes by selectively controlling the ventilation unit and the exhaust unit in consideration of at least one or more factors among an internal temperature, pressure, and expected generation amount of chemical fumes, which are required corresponding to a substrate processing condition to be satisfied in a chamber and at least one or more factors among the current internal temperature, the pressure, and the chemical fume concentration in the chamber interior space 110 and the buffer space 250.

Since the control unit controls the ventilation unit and the exhaust unit, it is possible to form an exhaust airflow for causing chemical fumes to be more effectively introduced or discharged, in the buffer space 250.

In one example, the discharge amount of chemical fumes from the chamber interior space 110 into the buffer space 250 may be regulated in a manner that the flow meter 251 measures the discharge amount from the ventilation fan 210, and the control unit controls the ventilation fan 210 and the ventilation regulator 220 based on the measured amount.

Also, in one example, the discharge amount of chemical fumes stored in the buffer space 250 may be regulated in a manner that the concentration meter 255 in the buffer space 250 measure the chemical fume concentration, the flow meter 253 measures the discharge amount from the exhaust tube 261, and the control unit controls the ventilation fan and the ventilation regulator based on the measured values.

As described above, in the present invention, since the chemical fume discharge amount in the chamber interior space is regulated, and the chemical fumes are temporarily stored in the buffer space, and then the chemical fume discharge amount in the buffer space is regulated, and the chemical fumes are discharged, it is possible to reduce the environmental change of the chamber interior space to the minimum, and thus to stably maintain a requirement for a substrate processing process.

Details examples of the components of the exhausting device in the substrate processing equipment according to the present invention will be described below.

Figure 3:
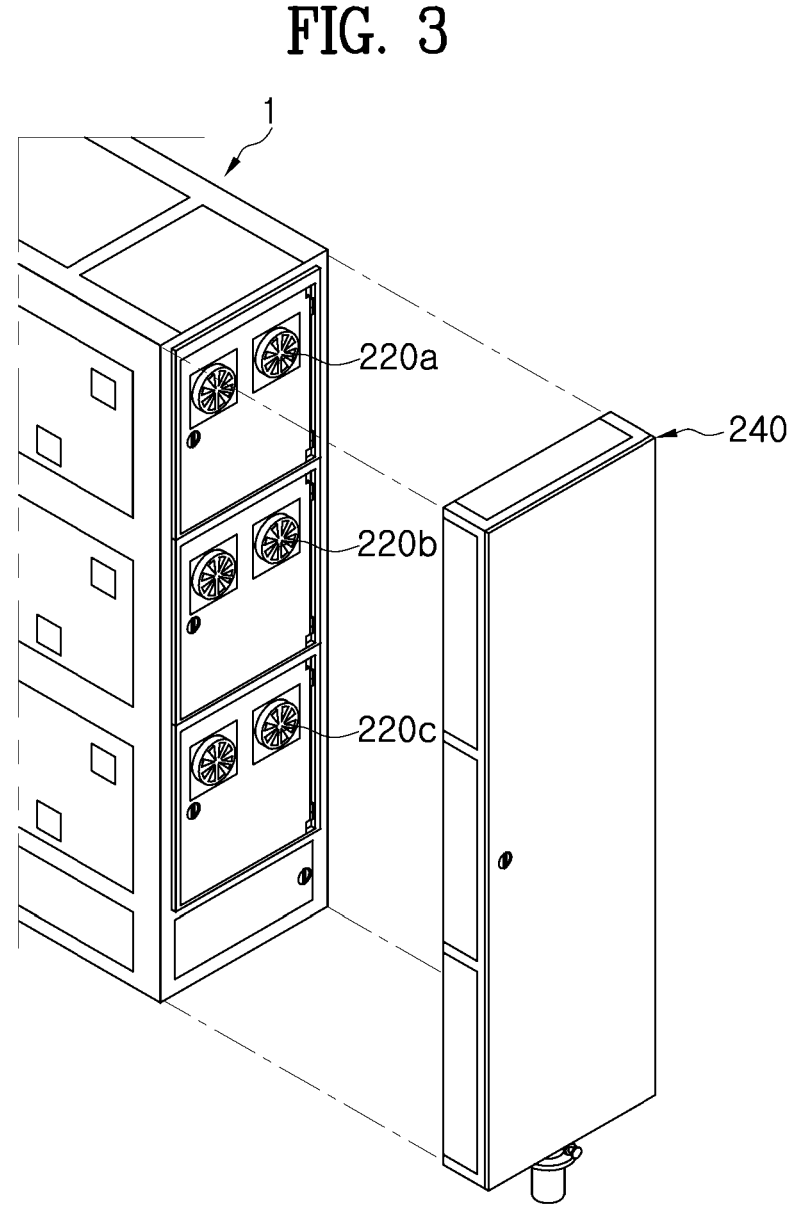
FIGS. 3, 4A and 4B illustrate an example in which the exhausting device according to the present invention is mounted to the substrate processing equipment.
Figure 4A:
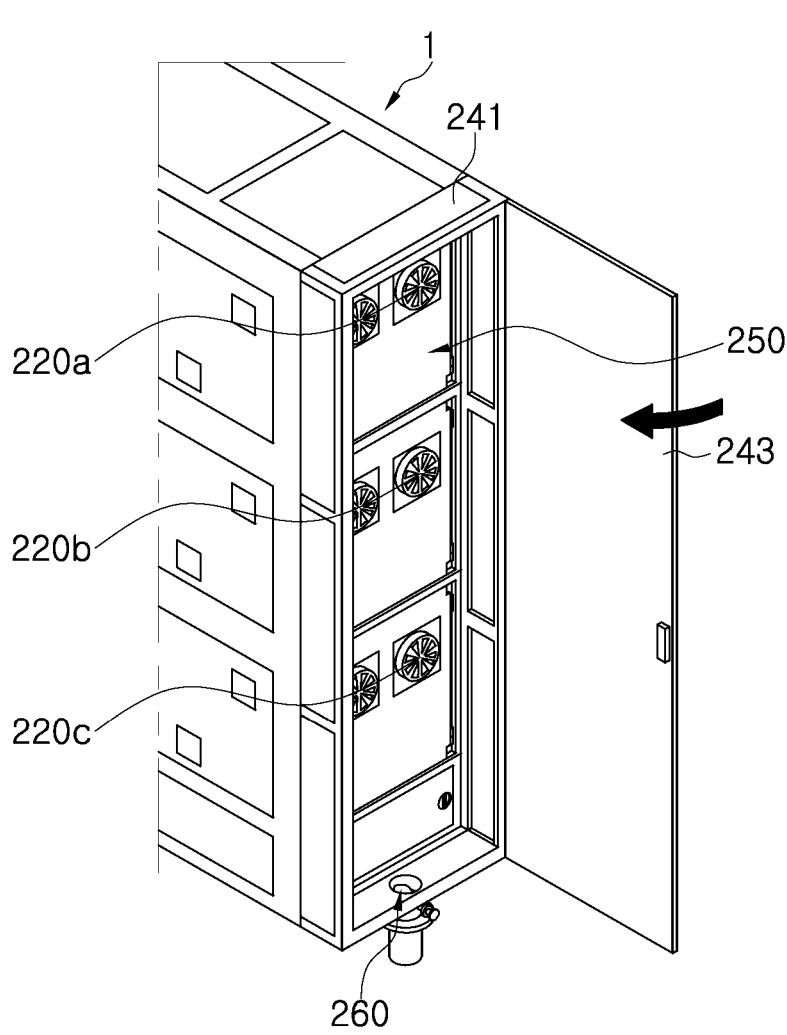
Figure 4B:
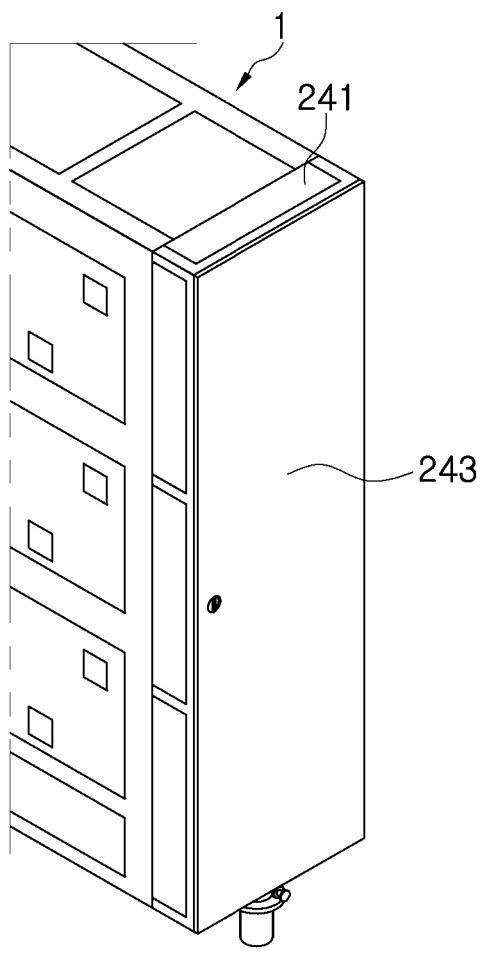

FIGS. 3 to 4B illustrate an example in which the exhausting device according to the present invention is mounted to the substrate processing equipment.

The exhausting device according to the present invention can be mounted while maintaining the substrate processing equipment, which is already installed, without changing the existing substrate processing equipment.

The ventilation fan and ventilation regulators 220a, 220b, and 220c in the ventilation unit are mounted at portions at which chemical fumes are discharged in the substrate processing equipment 1. A buffer member 240 is mounted in close contact with the side surface of the substrate processing equipment 1 to include the ventilation fan and ventilation regulators.

The buffer member 240 includes a bulkhead frame 241 and a cover 243.

One side of the bulkhead frame 241 is mounted in close contact with the side surface of the substrate processing equipment 1, and a portion at which the bulkhead frame and the substrate processing equipment are coupled to each other is sealed. The cover 243 is mounted on the other side of the bulkhead frame 241, and a sealing member for sealing may be provided at a portion at which the cover 243 and the bulkhead frame 241 are in contact with each other.

The cover 243 may have a door function for opening the buffer space 250 by being mounted on the bulkhead frame 241 so as to be rotatable with respect to one side.

The buffer member 240 including the bulkhead frame 241 and the cover 243 is coupled to the side surface of the substrate processing equipment 1 to form the sealed buffer space 250 in the buffer member 240. An exhaust unit 260 that discharges chemical fumes stored in the buffer space 250 is provided in the bulkhead frame 241 at the bottom of the buffer space 250.

The example illustrated in FIGS. 3 to 4B corresponds to a case where the buffer member 240 is mounted to the substrate processing equipment 1 provided with a plurality of chambers having a multi-level structure, so as to form the buffer space 250 that stores chemical fumes discharged from the plurality of chambers.

Figure 5A:
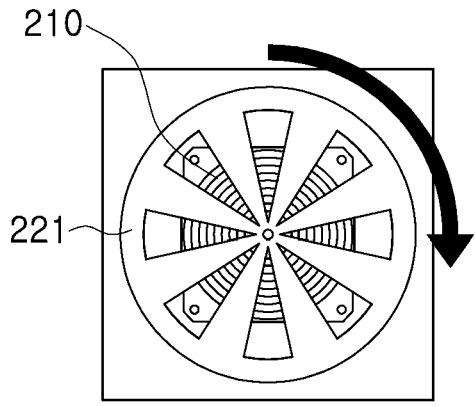
FIGS. 5A to 5C illustrate an example of a ventilation unit in the exhausting device according to the present invention.
Figure 5B:
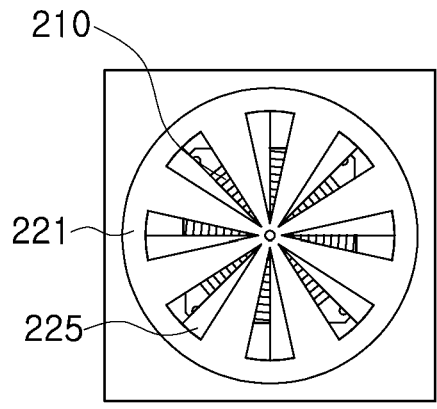
Figure 5C:
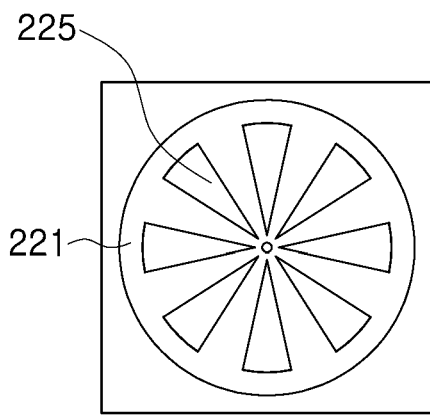

FIGS. 5A to 5C illustrate an example of the ventilation unit in the exhausting device according to the present invention.

The ventilation unit is mounted at a portion at which chemical fumes are discharged from the chamber interior space in the substrate processing equipment 1. The ventilation unit includes the ventilation fan 210 and the ventilation regulator 220.

The ventilation regulator 220 may include a shutter frame 221 and a shutter 225.

The shutter frame 221 is mounted on the outer surface of the ventilation fan 210. A plurality of through holes are formed in the shutter frame 221. The shutter 225 is rotatable by a predetermined angle corresponding to the through holes of the shutter frame 221 to selectively open and close the through holes.

The shutter 225 may be adjusted to fully open the through hole as illustrated in FIG. 5A or may be adjusted to partially open the through hole as illustrated in FIG. 5B. The shutter 225 may be adjusted to completely close the through hole as illustrated in FIG. 5C.

The control unit controls an output of the ventilation fan 210 and an operation of opening or closing with the shutter 225, and thus it is possible to regulate the discharge amount of chemical fumes from the chamber interior space into buffer space.

Figure 6:
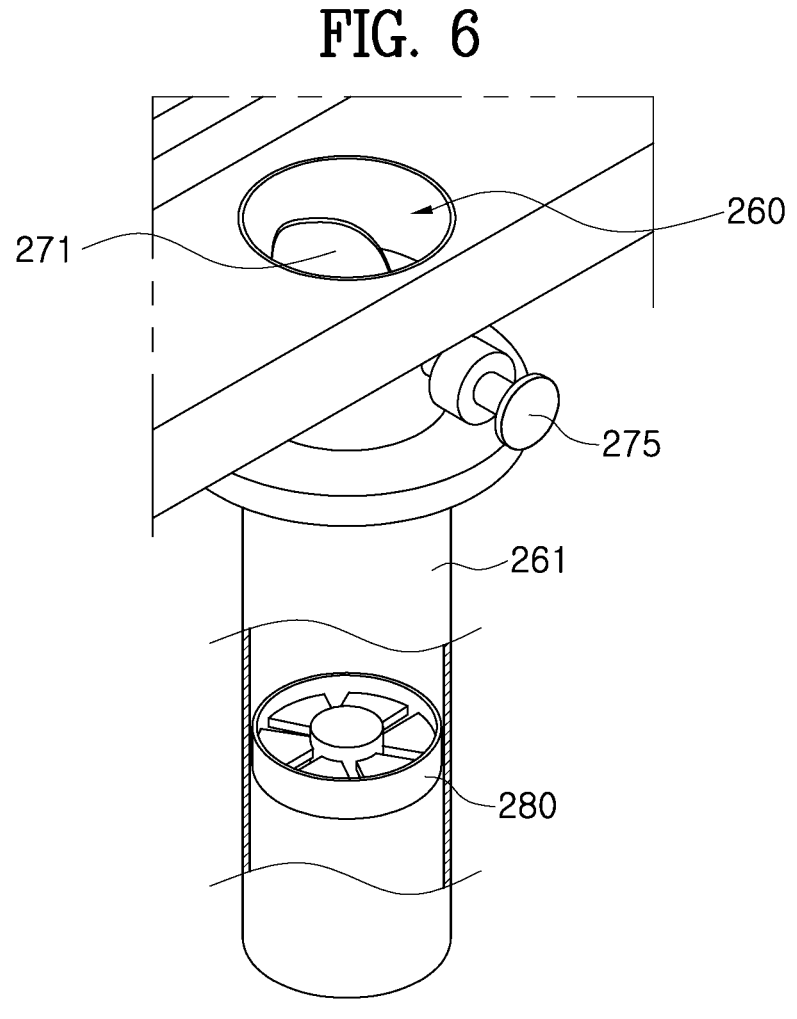
FIG. 6 illustrates an example of an exhaust unit in the exhausting device according to the present invention.

FIG. 6 illustrates an example of the exhaust unit in the exhausting device according to the present invention.

The exhaust unit may include the exhaust tube 261 connected to the buffer space through the bulkhead frame 241, the exhaust pressure generator 280 that is mounted in the exhaust tube 261 and regulates the discharge amount from the exhaust tube 261, and the exhaust pressure regulator that is mounted in the exhaust tube 261 in front of the exhaust pressure generator 280 and regulates the exhaust pressure of the exhaust pressure generator 280.

The exhaust pressure generator 280 may be configured to include a motor and a blade rotating by the motor to generate the pressure that makes a fluid flow by the rotation of the blade.

The exhaust pressure regulator is capable of controlling the flow of the fluid in the exhaust tube 261 by opening or closing the exhaust tube 261. The exhaust pressure regulator will be described with reference to an example of an operation mode illustrated in FIGS. 7A and 7B.

The exhaust pressure regulator may include a support 273, an actuator 275 that rotates the supports 273, and dampers 271a and 271b. The support 273 is installed at the middle of the exhaust tube 261 in the radial direction of the exhaust tube 261. The dampers 271a and 271b are supported by the support 273 and selectively open or close the exhaust tube 261 by rotation of the support 273.

Figure 7A:
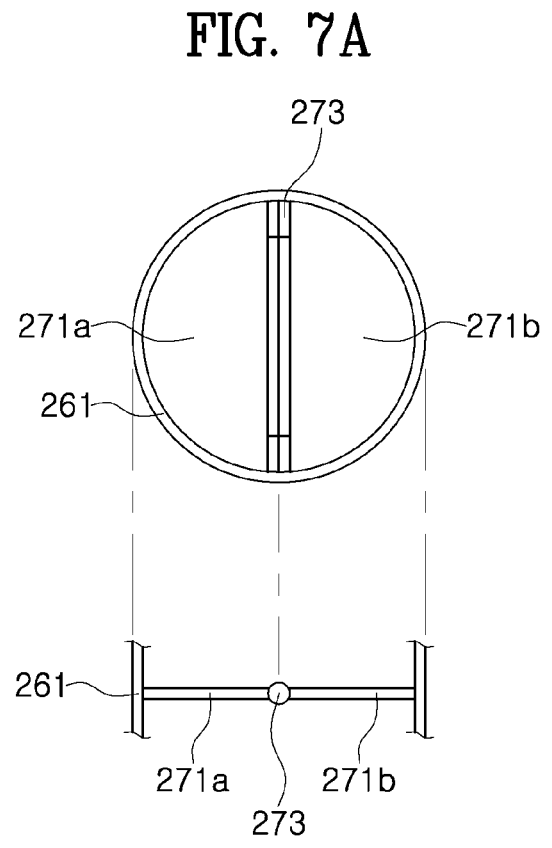
Figure 7B:
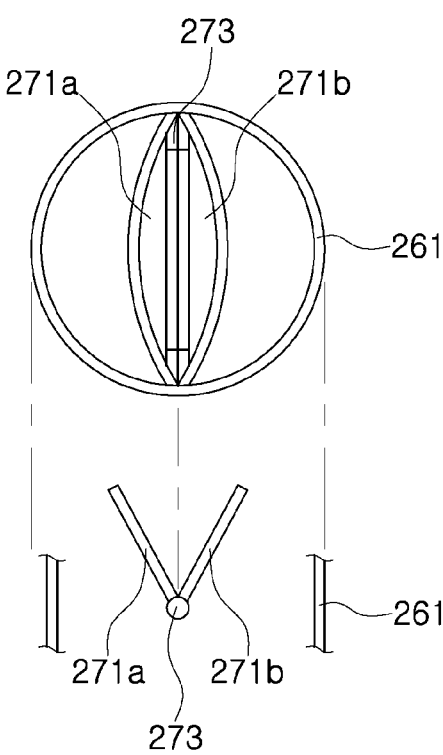

As in the example illustrated in FIGS. 7A and 7B, the dampers 271a and 271b are fastened to both sides of the support 273 to correspond to the cross-sectional shape of the exhaust tube 261, and rotates around the support 273 by the rotation of the support 273 to open or close the exhaust tube 261.

The exhaust pressure regulator illustrated in FIGS. 6 to 7B is just an example, and may be modified into various forms of being installed in the exhaust tube and capable of adjusting the amount of the fluid flowing through the exhaust tube.

The control unit controls the operations of the exhaust pressure generator 280 and the exhaust pressure regulator, and thus it is possible to regulate the discharge amount of chemical fumes stored in the buffer space.

In the exhausting device described with reference to the example illustrated in FIGS. 3 to 4B, one integrated buffer space 250 that stores all chemical fumes discharged from a plurality of chambers is formed for the substrate processing equipment 1 provided with the plurality of chambers having a multi-level structure. If necessary, the buffer space may be divided to individually store chemical fumes discharged from each of the plurality of chambers.

Figure 8:
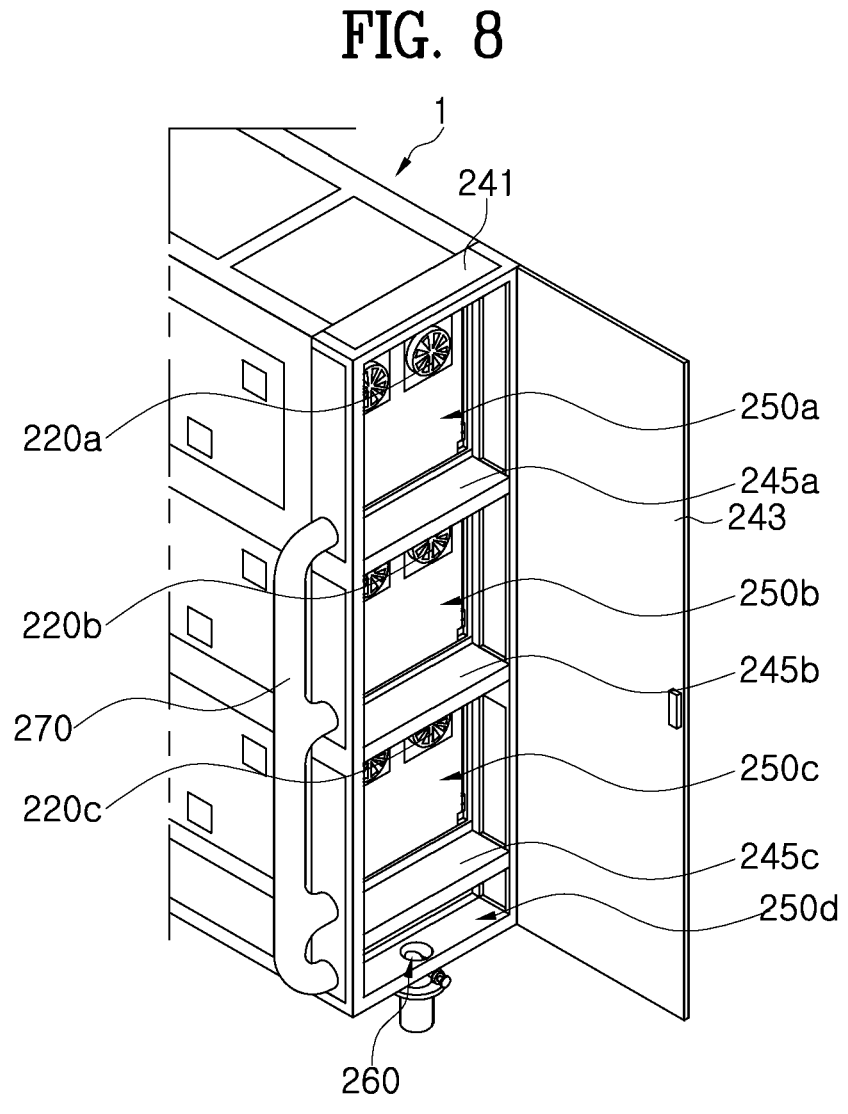
FIG. 8 illustrates a modification example of the exhausting device according to the invention.

In this regard, a modification example of the exhausting device according to the present invention will be described with reference to FIG. 8.

For the substrate processing equipment 1 provided with a plurality of chambers having a multi-level structure, the respective buffer spaces that temporarily store chemical fumes for each level may be provided.

For this, partition frames 245a, 245b, and 245c are provided on the bulkhead frame 241 to partition the buffer space corresponding to the ventilation unit that discharges chemical fumes of the chamber in each level. For example, the partition frames 245a, 245b, and 245c divides the buffer space into three buffer spaces in three vertical levels. In each buffer space, a corresponding ventilation unit is installed to discharge chemical fumes of the chamber in a corresponding level.

The buffer space is partitioned into levels by the partition frames 245a, 245b, and 245c to form buffer spaces 250a, 250b, and 250c. Chemical fumes stored in the buffer spaces 250a, 250b, and 250c at the respective levels may be discharged to the exhaust tube 261 through the bottom buffer space 250d connected to the exhaust tube 261 of the exhaust unit.

A branch exhaust tube 265 for discharging chemical fumes is connected to each of the buffer spaces 250a, 250b, and 250c obtained by partitioning into the levels. The branch exhaust tube 265 is connected to the bottom buffer space 250d.

An exhaust pressure generator (not illustrated) that regulates the discharge amount from the branch exhaust tube 265 and an exhaust pressure regulator (not illustrated) that regulates the exhaust pressure of the exhaust pressure generator may be provided in the branch exhaust tube 265 to correspond to the buffer spaces 250a, 250b, and 250c obtained by partitioning into the respective levels.

Since the exhaust pressure generator and the exhaust pressure regulator are similar to those in the above examples, a detailed description thereof will be omitted.

As described above, since, for the substrate processing equipment including a plurality of chambers in a multi-level structure, an independent buffer space is provided corresponding to the chamber at each level to control the discharge of chemical fumes, it is possible to control the environment required for each chamber interior space in the substrate processing process in more detail.

In addition, the present invention provides an exhaust method using the above-described exhausting device in the substrate processing equipment according to the present invention. An example of the exhausting method in the substrate processing equipment according to the present invention will be described below.

FIG. 9 is a flowchart illustrating an example of the exhausting method in the substrate processing equipment according to the present invention.

In the exhausting method in the substrate processing equipment according to the present invention, chemical fumes in the chamber interior space are discharged into the buffer space through the ventilation unit while regulating the discharge amount in consideration of the environment of the chamber interior space (S100).

The chemical fumes discharged from the chamber interior space are stored in the buffer space (S200). A step (S300) of discharging the chemical fumes stored in the buffer space while regulating the discharge amount by the exhaust unit in consideration of the current state of the buffer space may be provided.

The steps in the exhausting method in the substrate processing equipment according to the present invention will be described in more detail.

FIG. 10 is a flowchart illustrating an example of a procedure of discharging chemical fumes in the chamber interior space in the exhausting method in the substrate processing equipment according to the present invention.

Various environmental factors such as the current internal temperature, the pressure, and the chemical fumes concentration in the chamber interior space and the buffer space are measured, and the current states of the chamber interior space and the buffer space are determined based on the measured factors (S110).

For example, the temperature difference, the pressure difference, the chemical fumes concentration difference, and the like between the chamber interior space and the buffer space are grasped by measuring the temperature, the pressure, the chemical fumes concentration, and the like in the chamber interior space and the buffer space.

The internal temperature, the pressure, and the like required corresponding to the substrate processing process conditions to be performed in the chamber are grasped, and the expected generation amount of chemical fumes during substrate processing is predicted. Then, the requirements corresponding to the substrate processing process conditions to be performed in the chamber are determined (S130).

For example, the environmental factors such as the internal temperature and the pressure required for performing the substrate processing process in the chamber and the environmental factors of the expected generation amount of chemical fumes generated accordingly are grasped, and the requirements for performing the substrate processing process are determined based on the grasped factors.

In addition, the changed state of the environmental factors such as the internal temperature, the pressure, the chemical fumes concentration in the chamber interior space in accordance with the chemical fume discharge amount in the chamber interior space is predicted based on the current states of the chamber interior space and the buffer space (S140).

When the current states of the chamber interior space and the buffer space and the requirements for performing the corresponding substrate processing process are grasped, the chemical fumes in the chamber interior space are discharged into the buffer space based on the current states and the requirements (S150).

In some embodiments, the chemical fumes may be discharged into the buffer space while regulating the discharge amount of chemical fumes discharged from the chamber interior space so that the changed state of the chamber interior space satisfies the requirement.

That is, when a large amount of chemical fumes in the chamber interior space is discharged to the outside having a difference in temperature and pressure, environmental changes such as the temperature and the pressure may occur in the chamber interior space. In the present invention, by providing the buffer space, the chemical fumes in the chamber interior space are controlled and discharged into the buffer space while maintaining the environments of the chamber interior space and the buffer space to be similar to each other. Thus, it is possible to appropriately maintain the environmental conditions required for performing the corresponding substrate processing process in the chamber interior space.

The chemical fumes discharged from the chamber interior space are temporarily stored in the buffer space (S200).

Then, the chemical fumes stored in the buffer space are discharged to the outside in consideration of the current state of the buffer space.

Figure 11:
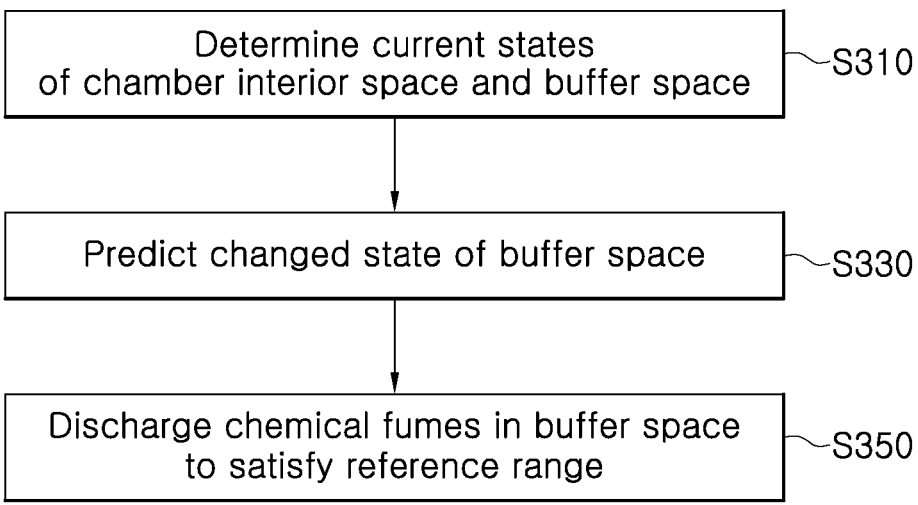
FIG. 11 is a flowchart illustrating an example of a procedure of discharging chemical fumes in a buffer space in the exhausting method in the substrate processing equipment according to the present invention.

With respect to the step of discharging chemical fumes from the buffer space, FIG. 11 is a flowchart illustrating an example of a procedure of discharging the chemical fumes in the buffer space in the exhausting method in the substrate processing equipment according to the present invention.

Before the chemical fumes are discharged from the buffer space, various environmental factors such as the current temperature, the pressure, and the chemical fumes concentration in the chamber interior space and the buffer space are measured, and the current states of the chamber interior space and the buffer space are determined based on the measured factors (S310).

In addition, the changed state of the environmental factors such as the internal temperature, the pressure, the chemical fumes concentration in the buffer space in accordance with the chemical fume discharge amount in the buffer space is predicted based on the current states of the chamber interior space and the buffer space (S330).

When the current states of the chamber interior space and the buffer space and the changed state by the discharge of the chemical fumes in the buffer space are grasped, the chemical fumes are discharged by regulating the discharge amount so that the changed state of the buffer space satisfies a preset reference range (S350).

Furthermore, the step of discharging chemical fumes in the chamber interior space and the step of discharging chemical fumes in the buffer space as described above may be repeated. With the repetition, it is possible to gradually increase the discharge amount while similarly maintaining the environmental states of the chamber interior space and the buffer space at a predetermined level.

That is, when there is a large difference between the environmental state of the chamber interior space and the environmental state of the buffer space, by gradually increasing the chemical fume discharge amount from the chamber interior space into the buffer space, it is possible to discharge the chemical fumes while reducing the difference in environmental state between the chamber interior space and the buffer space.

According to the present invention described above, the chemical fume discharge amount in the chamber interior space is regulated, and the chemical fumes are temporarily stored in the buffer space, and then the chemical fume discharge amount in the buffer space is regulated, and the chemical fumes are discharged. Thus, it is possible to reduce the environmental change of the chamber interior space to the minimum, and thus to stably maintain a requirement for a substrate processing process.

In particular, when a plurality of chambers are disposed in substrate processing equipment and substrate processing processes are simultaneously performed, the environmental conditions in each chamber interior space may change differently depending on the discharge of the chemical fumes, but the environment in the chamber interior space can be maintained at a predetermined level by the buffer space, and thus it is possible to perform mass production while maintaining the quality of the same level in multiple chambers.

Although the above description of the present disclosure has been provided for illustrative purposes, those skilled in the art will appreciate that various modifications, additions, and substitutions are possible, without departing from essential characteristics of the disclosure. Therefore, embodiments of the present disclosure are not intended to limit the technical spirit of the disclosure but rather to describe the technical spirit of the disclosure, and the scope of the disclosure is not to be limited by the above embodiments. The protection scope of the present invention should be construed by the following claims, and all technical ideas within the scope equivalent thereto should be construed as being included in the scope of the present invention.

What is claimed is:

1. An exhausting device in substrate processing equipment, the device comprising:
   a ventilation unit that discharges chemical fumes in a chamber interior space;
   a buffer member that forms a sealed buffer space on an outer surface of the ventilation unit and stores the chemical fumes discharged from the ventilation unit to control a processing process environment in the chamber interior space,
   wherein the processing process environment corresponds to an internal condition of the chamber interior space represented by a pressure of the chamber interior space or a temperature thereof, and
   wherein the buffer member includes:
      a bulkhead frame defining the buffer space and having a first side connected to the outer surface of the ventilation unit and a second side opposite to the first side, and
      a cover rotatably coupled to the second side of the bulkhead frame to seal the buffer space or open the buffer space; and
   an exhaust unit connected to the buffer member and discharging the chemical fumes stored in the buffer space,
   a control circuit that controls the ventilation unit and the exhaust unit to regulate an inflow amount and a discharge amount of the chemical fumes with respect to the buffer space, so as to control the processing process environment in the chamber interior space.

2. The exhausting device in substrate processing equipment according to claim 1,
   wherein the control circuit controls a discharge of the chemical fumes by selectively controlling the ventilation unit and the exhaust unit according to:
      at least one of factors among an internal temperature, a pressure, and an expected generation amount of chemical fumes, which are substrate processing conditions to be satisfied in a chamber, and at least one of factors among a current internal temperatures, a pressure, and a chemical fume concentration in each of the chamber interior space and the buffer space.

3. The exhausting device in substrate processing equipment according to claim 2,
   wherein the control circuit controls the ventilation unit and the exhaust unit to form an exhaust air flow in the buffer space.

4. The exhausting device in substrate processing equipment according to claim 1,
   wherein the ventilation unit includes:
   a ventilation fan for discharging the chemical fumes in the chamber interior space to the sealed buffer space, and
   a ventilation regulator mounted on the ventilation fan to regulate a discharge amount of the ventilation fan.

5. The exhausting device in substrate processing equipment according to claim 4,
   wherein the ventilation regulator includes:
   a shutter frame that is mounted on an outer surface of the ventilation fan and has a plurality of through holes formed in the shutter frame, and
   a plurality of shutters that is provided with the plurality of through holes, respectively, and each shutter of the plurality of shutters selectively opens or closes a corresponding through hole of the plurality of through holes in accordance with rotation by a predetermined angle.

6. The exhausting device in substrate processing equipment according to claim 5,
   wherein the ventilation unit further includes a flow meter that measures the discharge amount from the ventilation fan, and
   wherein the control circuit controls the ventilation fan and the ventilation regulator based on a measured amount of the flow meter, to regulate a discharge amount of the chemical fumes from the chamber interior space into the buffer space.

7. The exhausting device according to claim 1,
   wherein the exhaust unit includes:
   an exhaust tube connected to the buffer space, and
   an exhaust pressure generator that is mounted in the exhaust tube and regulates a discharge amount from the exhaust tube.

8. The exhausting device in substrate processing equipment according to claim 7,
   wherein the exhaust unit further includes an exhaust pressure regulator mounted in the exhaust tube in front of the exhaust pressure generator to regulate exhaust pressure of the exhaust pressure generator.

9. The exhausting device in substrate processing equipment according to claim 8, wherein the exhaust pressure regulator includes:
   a support installed at the middle of the exhaust tube in a radial direction of the exhaust tube, and
   a damper that is supported by the support and selectively opens or closes the exhaust tube in accordance with rotation of the support.

10. The exhausting device in substrate processing equipment according to claim 8,
   wherein the exhaust unit further includes:
   a concentration meter that is mounted at an inlet of the exhaust tube and measures chemical fume concentration in the buffer space, and
   a flow meter that measures the discharge amount from the exhaust tube, and
   wherein the control circuit controls the exhaust pressure generator and the exhaust pressure regulator based on measured amounts of the flow meter and the concentration meter, to regulate a discharge amount of the chemical fumes stored in the buffer space.

11. The exhausting device in substrate processing equipment according to claim 1,
   wherein the ventilation unit is provided in two or more ventilation units,
   wherein the buffer member further includes one or more partition frames that are connected to the bulkhead frame, and
   wherein the one or more partition frames partition the buffer space to two or more buffer spaces, in each buffer space of the two more buffer spaces, a corresponding ventilation unit of the two or more ventilation units being installed.

12. The exhausting device in substrate processing equipment according to claim 11,
   wherein the exhaust unit includes:
   a branch exhaust tube for discharging chemical fumes into each of a plurality of partitioned buffer spaces,
   an exhaust tube for discharging the chemical fumes in the branch exhaust tube,
   an exhaust pressure generator that is mounted in the branch exhaust tube corresponding to each of the plurality of partitioned buffer spaces and regulates a discharge amount from the branch exhaust tube, and
   an exhaust pressure regulator mounted in the branch exhaust tube in front of the exhaust pressure generator to regulate exhaust pressure of the exhaust pressure generator.

13. The exhausting device in substrate processing equipment according to claim 11,
   wherein the buffer member has a plurality of buffer spaces partitioned in a multi-level structure to correspond to a plurality of chambers installed in a multi-level structure.

* * * * *